United States Patent
Wang et al.

(10) Patent No.: US 7,034,579 B2
(45) Date of Patent: Apr. 25, 2006

(54) HIGH-SPEED SIGNAL LEVEL DETECTOR

(75) Inventors: Jin-sheng Wang, Plano, TX (US);
Heng-Chih Lin, Plano, TX (US);
Chien-Chung Chen, Plano, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 0 days.

(21) Appl. No.: 10/743,571

(22) Filed: Dec. 22, 2003

(65) Prior Publication Data

US 2005/0134327 A1    Jun. 23, 2005

(51) Int. Cl.
*H03K 5/22* (2006.01)

(52) U.S. Cl. .............................. 327/72; 327/77; 327/87
(58) Field of Classification Search .................. 327/72, 327/73, 74, 75, 77, 78–81, 87–89
See application file for complete search history.

(56) References Cited

U.S. PATENT DOCUMENTS

| | | | | |
|---|---|---|---|---|
| 4,926,068 A | * | 5/1990 | Fujita | 327/72 |
| 5,313,114 A | * | 5/1994 | Poletto et al. | 327/65 |
| 5,319,265 A | * | 6/1994 | Lim | 327/73 |
| 5,345,117 A | * | 9/1994 | Tomotsune | 327/98 |
| 5,416,484 A | * | 5/1995 | Lofstrom | 341/159 |
| 5,614,857 A | * | 3/1997 | Lim et al. | 327/205 |
| 6,114,982 A | * | 9/2000 | Hardy et al. | 341/159 |
| 6,229,352 B1 | * | 5/2001 | Chevallier et al. | 327/77 |
| 6,549,049 B1 | * | 4/2003 | Hinterscher | 327/206 |
| 6,781,428 B1 | * | 8/2004 | Chao et al. | 327/206 |

* cited by examiner

*Primary Examiner*—Tuan T. Lam
(74) *Attorney, Agent, or Firm*—William B. Kempler; W. James Brady, III; Frederick J. Telecky, Jr.

(57) ABSTRACT

A high-speed signal level detector employs the high gain and high bandwidth of an inverter to perform a comparison. The high-speed signal level detector is capable of achieving the desired high-speed level detection without demanding the substantial power consumption required when using either the averaging technique or a high bandwidth op-amp type comparator.

6 Claims, 6 Drawing Sheets

HIGH-SPEED SIGNAL LEVEL DETECTOR

BACKGROUND OF THE INVENTION

1. Field of the Invention

This invention relates generally to high-speed signal level detectors, and more particularly to a high-speed signal level detector that employs the high gain and high bandwidth of an inverter to perform a comparison.

2. Description of the Prior Art

The high-speed level detector for the input signal is very important for ensuring a fast response to incoming data for a high-speed data recovery circuit. Traditionally, a high-speed data recovery circuit employs an averaging technique to detect the input signal level, or employs an op-amp type comparator. Both techniques require significant power to achieve the requisite bandwidth and speed requirements. Further, the circuit is thus limited to the circuit bandwidth to detect the signal strength.

In view of the foregoing, it would be both beneficial and advantageous to provide a high-speed level detector capable of achieving the desired high-speed level detection without demanding the substantial power consumption required when using either the averaging technique or a high-bandwidth op-amp type comparator.

SUMMARY OF THE INVENTION

To meet the above and other objectives, the present invention provides a high-speed signal level detector that employs the high gain and high bandwidth of an inverter to perform a comparison. The high-speed signal level detector is capable of achieving the desired high-speed level detection without demanding the substantial power consumption required when using either the averaging technique or a high bandwidth op-amp type comparator. This high-speed signal level detector advantageously 1) functions independently of the circuit bandwidth to achieve the desired fast response, 2) is very simple to implement, and 3) requires less area to implement than circuits that employ more traditional design techniques such as using averaging or high bandwidth op-amp type comparison architectures.

According to one embodiment, a signal level detector comprises:

a first DC error amplifier operational to generate a control signal in response to a reference signal and a feedback signal; and a first inverter operational to generate the feedback signal in response to the first DC error amplifier control signal, wherein the first DC error amplifier control signal operates to set a switching point for the first inverter.

According to another embodiment, a signal level detector comprises:

first means for generating a first control signal in response to a first reference signal and further in response to a first feedback signal; and second means for controlling the first feedback signal in response to the first control signal, wherein the first control signal operates to set a switching point for the second means.

According to yet another embodiment, a method of controlling a level detector comprises the steps of:

providing a DC error amplifier having a positive input, a negative input and operational to generate an output control signal;

driving the negative input via a desired reference voltage; and driving the positive input via a self-biasing inverter feedback signal in response to the DC error amplifier output control signal to control a switching point associated with the self-biasing inverter.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
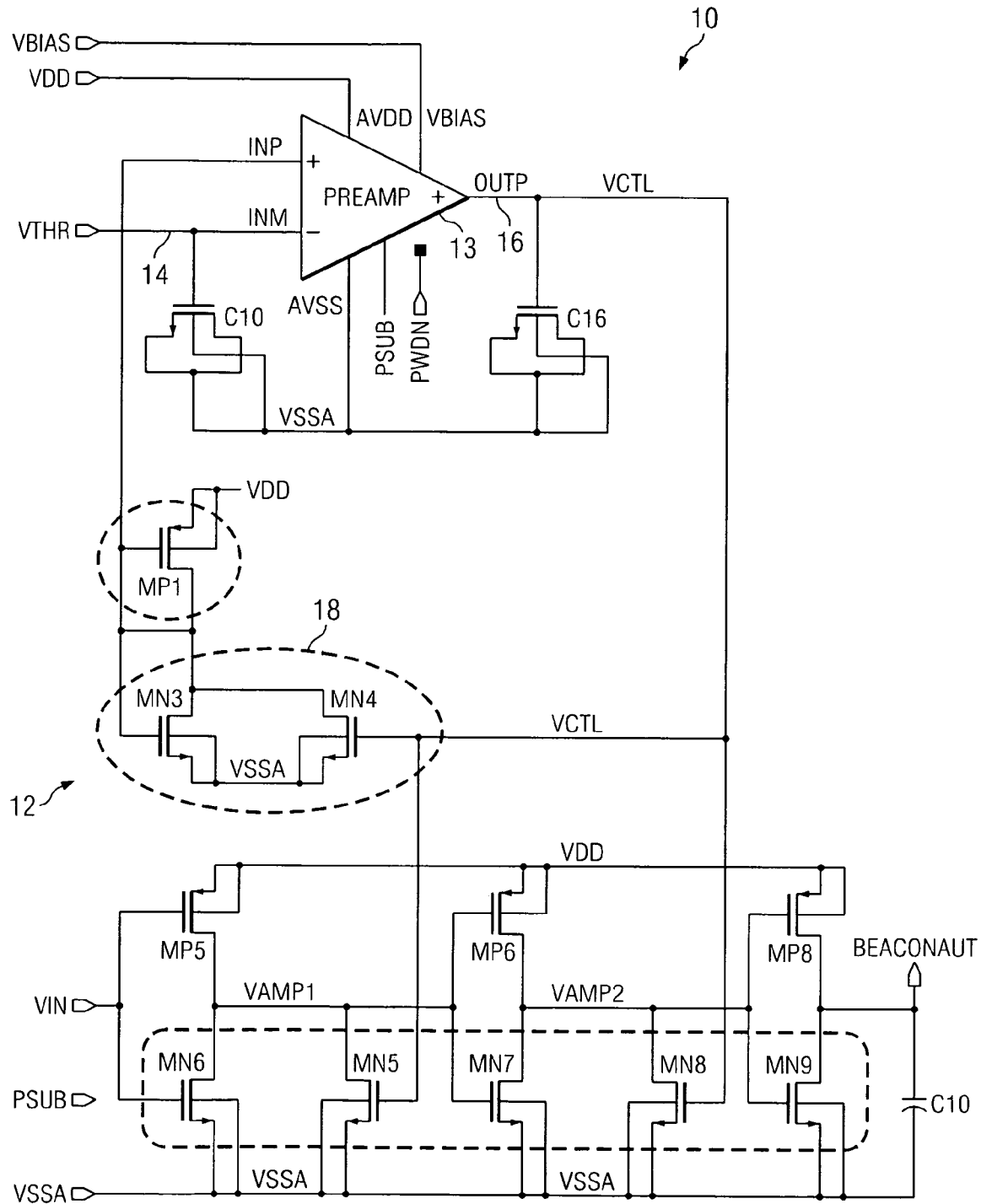
FIG. 1 is a schematic diagram illustrating a high-speed signal level detector according to one embodiment of the present invention.

FIG. 1 is a schematic diagram illustrating a high-speed signal level detector 10 according to one embodiment of the present invention. A high speed level detector for the input signal is very important for a high speed data recovery circuit to have a fast response to incoming data, as stated herein before. The working principle for the high-speed signal level detector 10 is by way of controlling the switching point of an inverter 12 that is comprised of transistors MP1, MN3 and MN4 to make a comparison. An error amplifier 13 can be seen to have its negative terminal connected to VTHR 14 that is generated via a reference source, and its positive terminal connected to the gates of inverter transistors MP1 and MN3. Due to the high DC gain of the error amplifier 13, its plus terminal will also be at VTHR, which will set the bias point of the inverter 12 in its high gain region. The control voltage (VCTL) 16 is the output of the error amplifier 13 that helps to adjust transistor MN4 (enumerated as number 18 within the oval containing transistors MN3 and MN4) to the requisite biasing point of the inverter 12.

Figure 2:
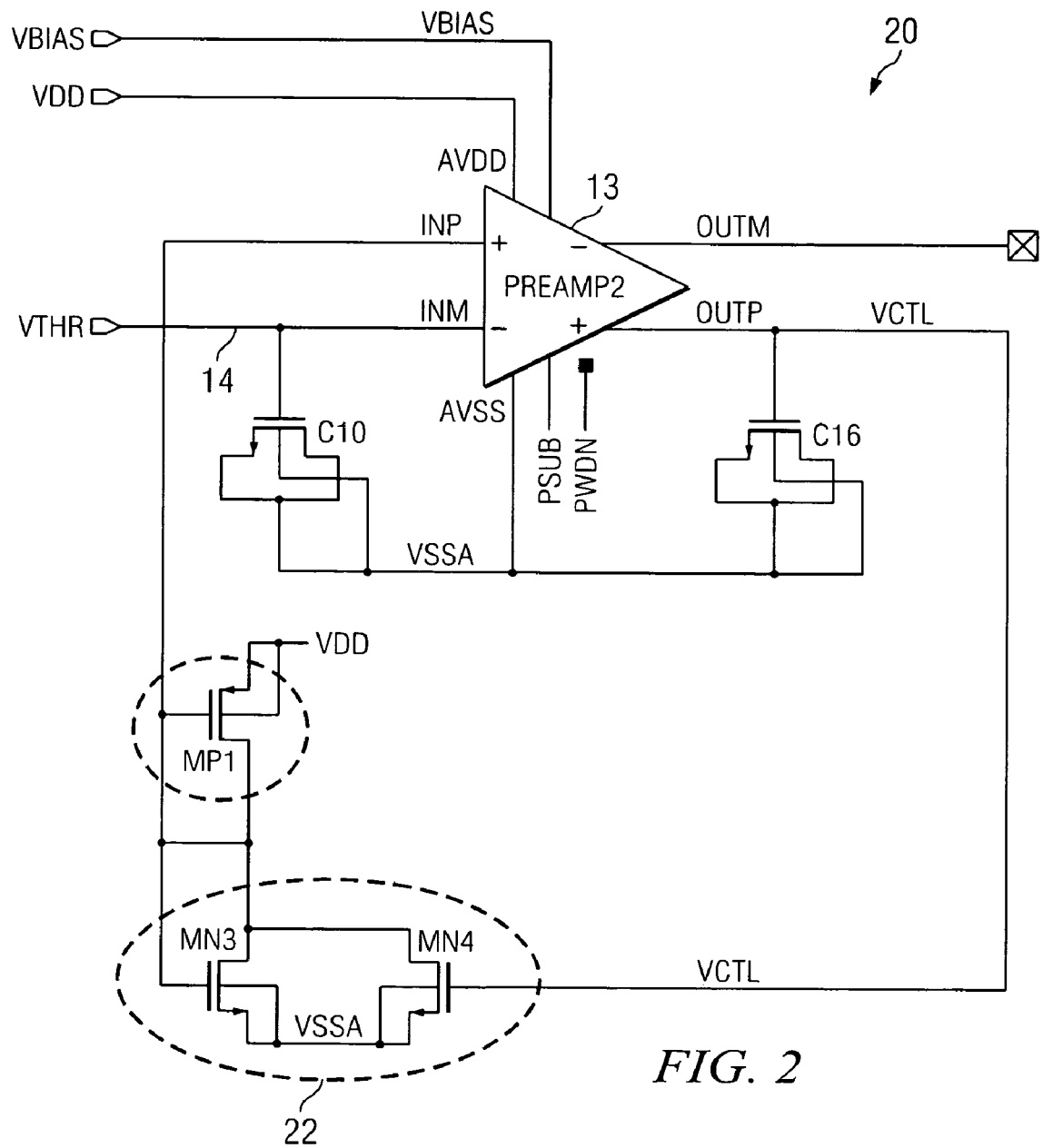
FIG. 2 is a schematic diagram illustrating the controlled trigger point generator portion of the high-speed signal level detector circuit 10 depicted in FIG. 1.

FIG. 2 is a schematic diagram illustrating the controlled trigger point generator portion 20 of the high-speed signal level detector circuit 10 depicted in FIG. 1. The self-bias inverter 22 discussed herein before, is depicted within the oval containing transistors MN3 and MN4; while the amplifier 13, as stated herein before, operates as an error amplifier.

Figure 3A:
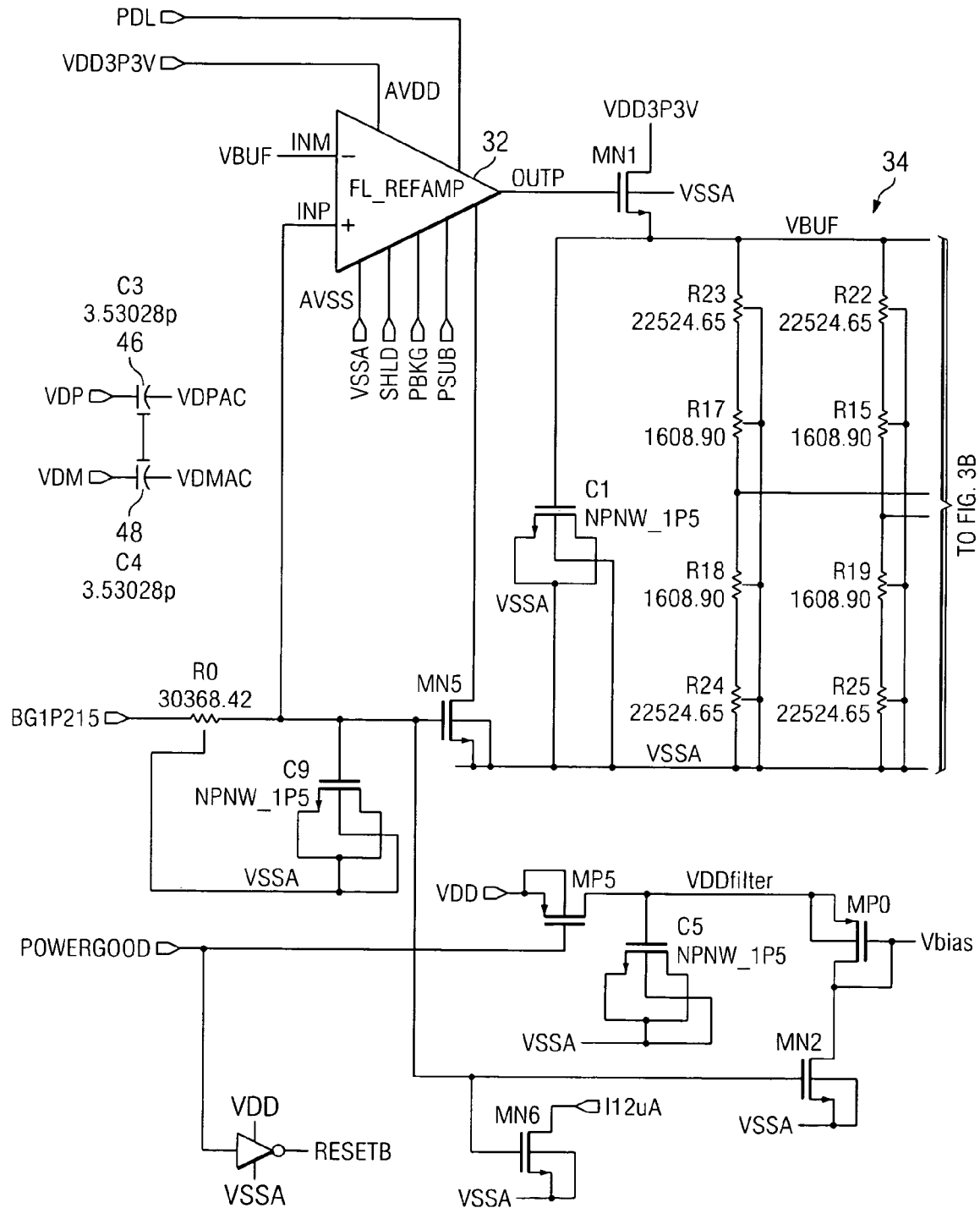
FIGS. 3A–3C show a schematic diagram illustrating a high-speed differential comparator that employs the high-speed signal level detector 10 shown in FIG. 1 according to one embodiment of the present invention.
Figure 3B:
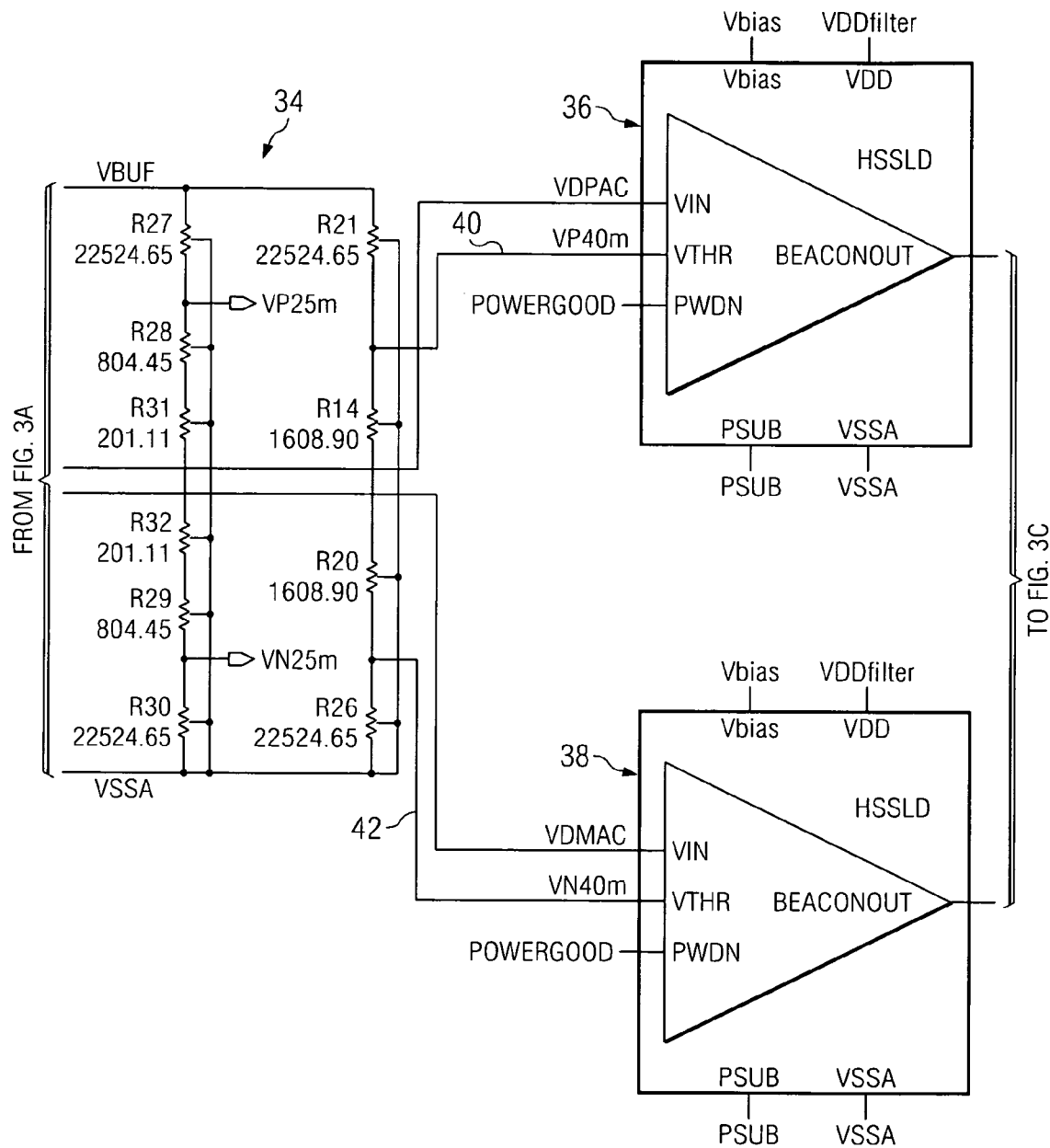
Figure 3C:
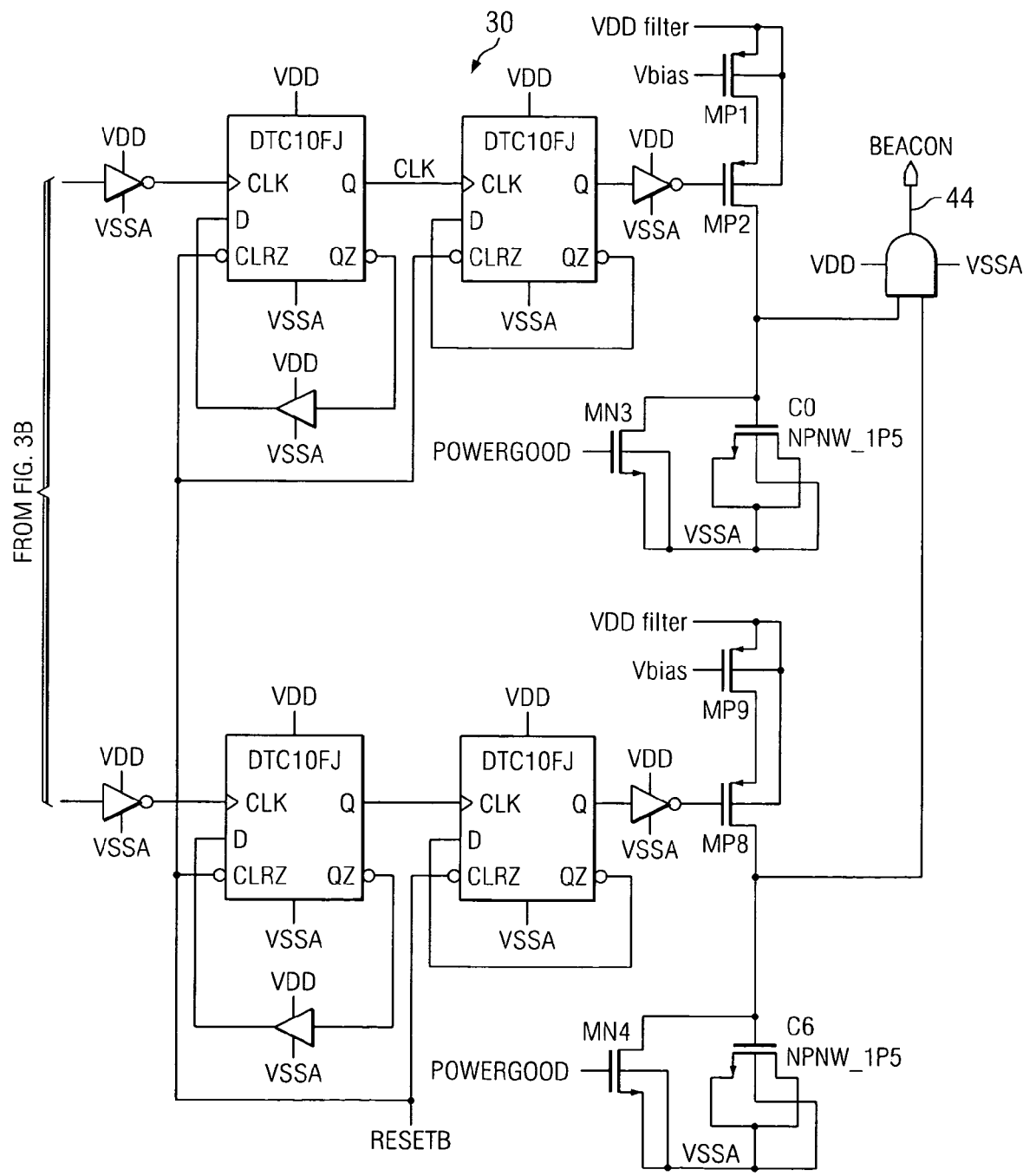
Figure 4A:
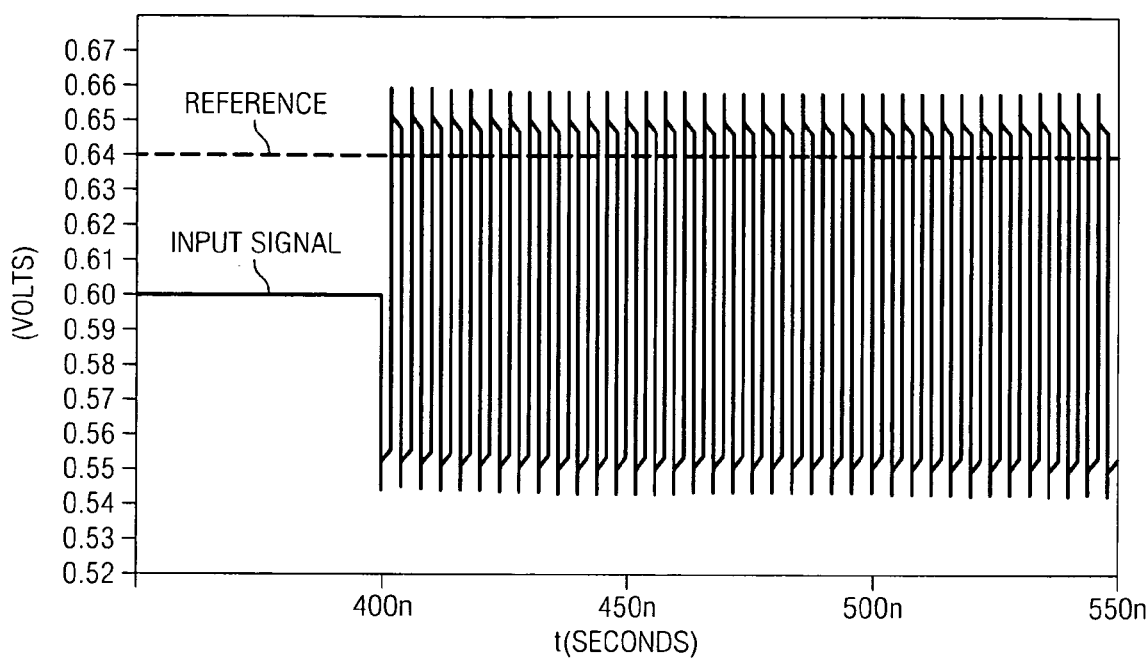
FIGS. 4A and 4B is a graph depicting simulated plots of performance for the high-speed differential comparator shown in FIG. 3.
Figure 4B:
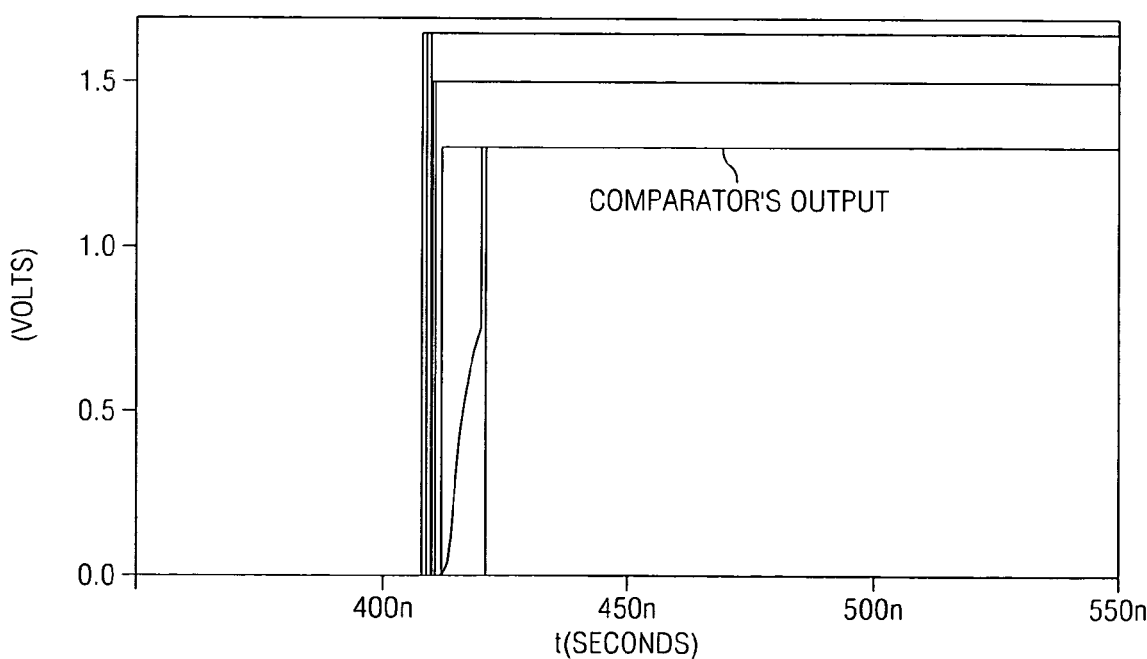

Looking now at FIGS. 3A–3C, a schematic diagram illustrates a high-speed differential comparator 30 that employs the high-speed signal level detector 10 shown in FIG. 1 according to one embodiment of the present invention. An input reference voltage through a reference amplifier 32 and a resistor string 34 functions to generate the differential voltage for the high speed comparators 36, 38, one with VTHP 40 and another with VTHN 42. If the input signal is larger than (VTHP-VTHN), the output 44 through the logic will be changed high as shown in FIG. 4. Since the amplitude for the application is AC, the high-speed differential comparator 30 employs AC coupling capacitors 46, 48 to eliminate the DC components of the signal.

FIG. 4 is a graph depicting simulated plots of performance for the high-speed differential amplitude detector 30 shown in FIG. 3. If the input signal is larger than (VTHP-VTHN), the output 44 through the logic will transition high, as stated herein before. Output transition plots are depicted for a plurality of different process corners, temperatures and voltages.

In view of the above, it can be seen the present invention presents a significant advancement in the art of high-speed level detector technology. Further, this invention has been described in considerable detail in order to provide those skilled in the amplitude level detector circuit art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A signal level detector comprising:
   a first DC error amplifier operational to generate a output signal in response to a reference signal and a feedback signal; and
   a first inverter operational to generate the feedback signal in response to the first DC error amplifier output signal, wherein the first DC error amplifier control signal operates to set a switching point for the first inverter;
   a second DC error amplifier;
   a second inverter, wherein the first and second DC error amplifiers and the first and second inverters together implement a differential comparator generating a desired output signal in response to a differential input signal determined via the switching point associated with the first inverter and a switching point associated with the second inverter and
   a signal inverter coupled to the first DC error amplifier output signal to set a switching point for the signal inverter, the signal inverter operating as an open loop signal level detector; wherein an input signal is coupled to the signal inverter for detecting a signal level of the input signal.

2. A signal level detector comprising:
   first means for generating a first control signal in response to a first reference signal and further in response to a first feedback signal; and
   second means for controlling the first feedback signal in response to the first control signal, wherein the first control signal operates to set a switching point for the second means;
   third means for generating a second control signal in response to a second voltage reference signal and a second feedback signal; and
   fourth means for controlling the second feedback signal in response to the second control signal, wherein the second control signal operates to set a switching point for the fourth means;
   fifth means coupled to the first feedback signal to set a switching point for the fifth means;
   sixth means coupled to the second feedback signal to set a switching point for the sixth means, wherein the first, second, third, fourth, fifth and sixth means together implement a differential comparator generating a desired output signal in response to a differential input signal voltage determined via the switching point associated with the second and fifth means and the switching point associated with the fourth and sixth means.

3. The signal level detector according to claim 2, wherein the third means for generating a second control signal comprises a DC error amplifier.

4. The signal level detector according to claim 2, wherein the fourth means for controlling the second feedback signal comprises a self-bias inverter.

5. A method of controlling a level detector, the method comprising the steps of:
   providing a DC error amplifier having a positive input, a negative input and operational to generate a first output control signal;
   driving the negative input via a desired reference voltage; and
   driving the positive input via a self-biasing inverter feedback signal in response to the first DC error amplifier output control signal to control a switching point associated with the self-biasing inverter;
   providing a second DC error amplifier having a positive input, a negative input and operational to generate an output control signal;
   driving the negative input of the second DC error amplifier via a second desired reference voltage; and
   driving the positive input of the second DC error amplifier via a second self-biasing inverter feedback signal in response to the second DC error amplifier output control signal to control a switching point associated with the second inverter;
   biasing a first signal inverter with the first DC error amplifier output control signal;
   biasing a second signal inverter with the second DC error amplifier output control signal;
   detecting a level of an input signal applied to inputs of the first and second signal inverters using the first and second signal inverters as open loop signal level detectors.

6. The method according to claim 5, further comprising the steps of:
   providing output logic operational to generate a desired output signal in response to a differential input signal generated via the first and second DC error amplifiers; and
   causing the desired output signal to change its logic state when the differential input signal reaches a desired difference level.

* * * * *